United States Patent [19]

Bitller et al.

[11] Patent Number: 5,105,337
[45] Date of Patent: Apr. 14, 1992

[54] HOUSING FOR UNDERWATER ELECTRONIC CIRCUITS

[75] Inventors: Jean-Pierre Bitller, Orsay; André Pelet, Maurepas; Guy Wirth, Paris; Monique Hang-Hu, Saintry sur Seine, all of France

[73] Assignee: Alcatel Cit, Paris, France

[21] Appl. No.: 635,064

[22] Filed: Dec. 28, 1990

[30] Foreign Application Priority Data

Dec. 29, 1989 [FR] France ................... 89 17464

[51] Int. Cl.$^5$ ............................................. H05K 7/20
[52] U.S. Cl. ................................. 361/386; 174/70 S;
361/396; 439/76; 439/485; 359/174
[58] Field of Search ............... 361/388, 380–389,
361/393, 394, 395, 396, 399, 412, 413, 415, 417,
419, 420; 439/76, 485, 487; 165/80.2, 80.3, 185,
179; 357/79, 81; 455/601; 174/16.3, 70 S

[56] References Cited

U.S. PATENT DOCUMENTS

| 4,528,615 | 7/1985 | Perry | 361/386 |
| 4,679,250 | 7/1987 | Davis | 455/601 |
| 4,858,068 | 8/1989 | Bittler | 361/380 |
| 4,962,445 | 10/1990 | Pelet | 174/70 S |

FOREIGN PATENT DOCUMENTS

| 0338477 | 10/1989 | European Pat. Off. . |
| 2596231 | 9/1987 | France . |
| 2153151 | 8/1985 | United Kingdom . |
| 2193552 | 2/1988 | United Kingdom . |

Primary Examiner—Gerald P. Tolin
Attorney, Agent, or Firm—Sughrue, Mion, Zinn, Macpeak & Seas

[57] ABSTRACT

A particular embodiment comprises:
  a rigid body which is closed in watertight manner at both ends;
  six thermally conductive rigid receptacles each having a face which is complementary in shape to the shape of the inside wall of the body, the receptacles containing electronic circuits;
  layers of thermally conductive flexible materials disposed between the wall and the faces of the receptacles;
  supports each supporting two receptacles;
  a fixed ring integral with the body;
  a removable ring fixed to the fixed ring; and
  fixing devices each including a screw, resilient washers, and an insulating sleeve, thereby exerting outwardly directed radial forces when the screws are screwed radially into the removable ring.

The housing is suitable for the repeaters of undersea connection cables.

6 Claims, 6 Drawing Sheets

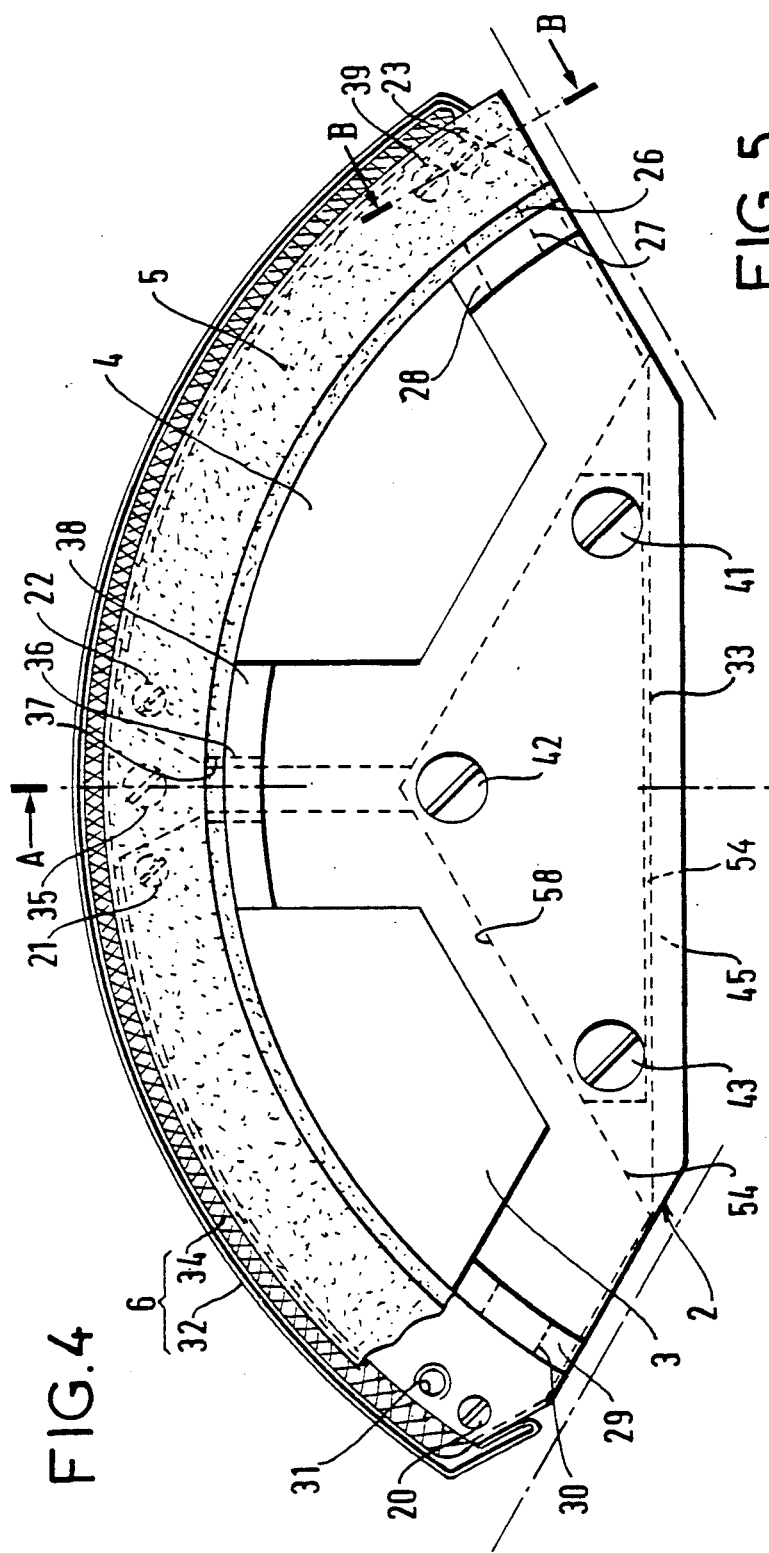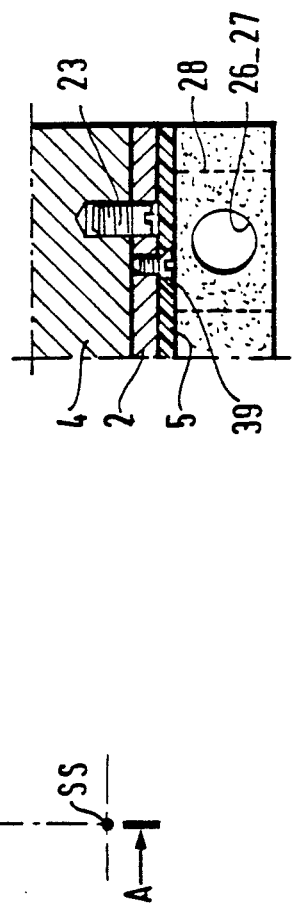

FIG.6
FIG.7
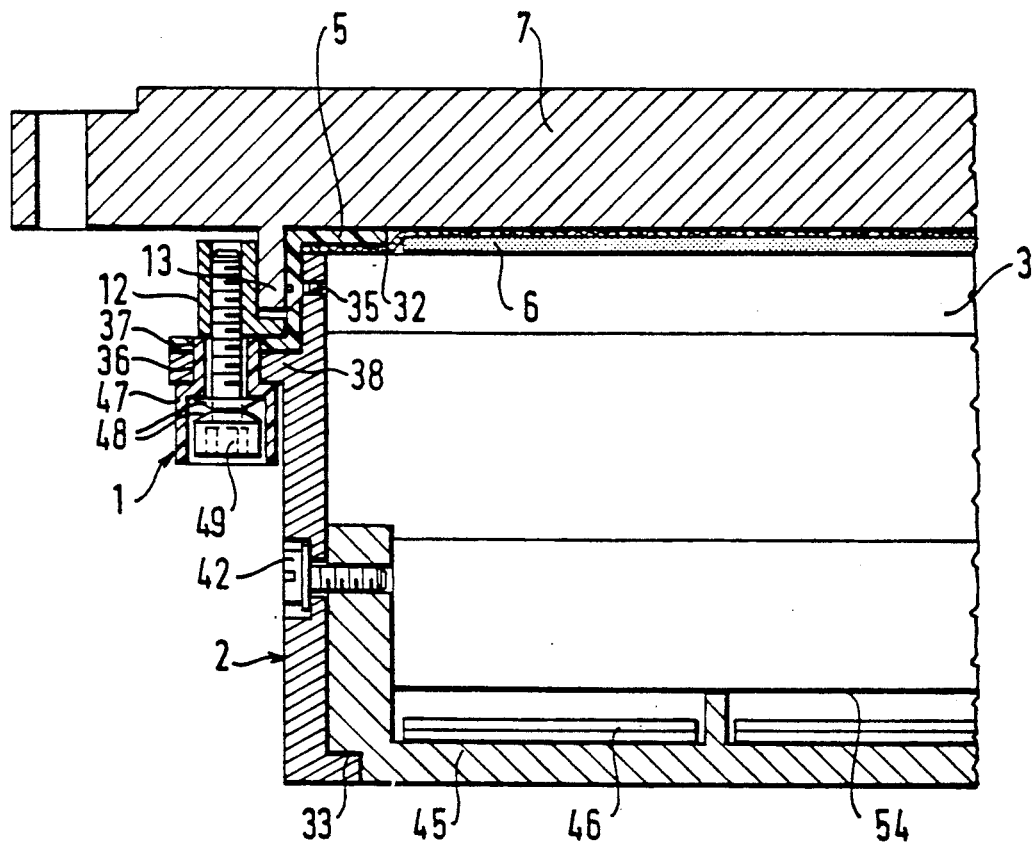
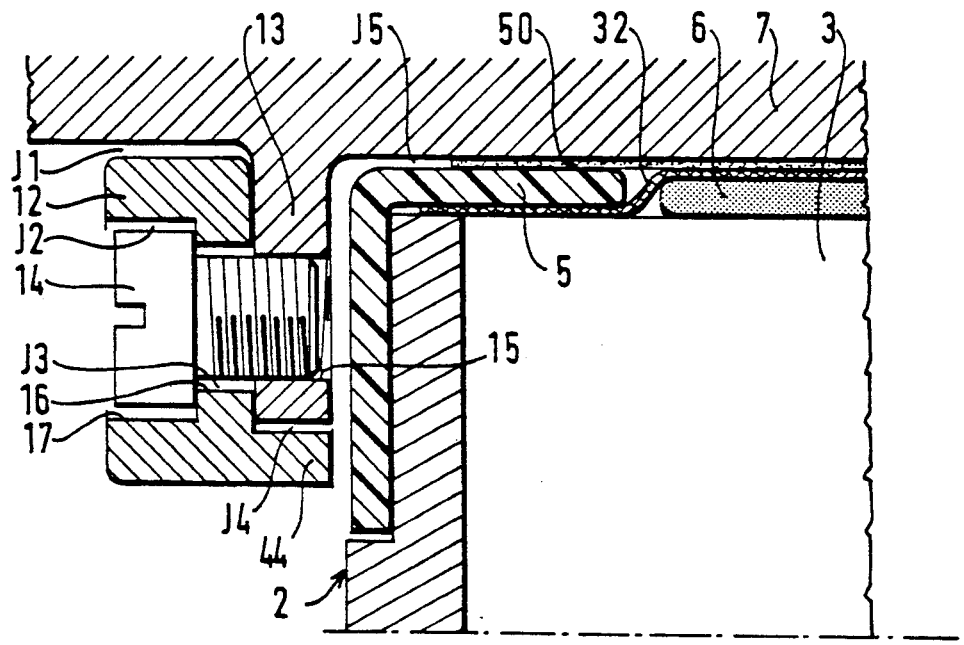

HOUSING FOR UNDERWATER ELECTRONIC CIRCUITS

The invention relates to a housing for underwater electronic circuits, such as the circuits constituting a repeater for an undersea communications cable.

BACKGROUND OF THE INVENTION

This type of housing must be mechanically strong in order to withstand laying and recovery operations which subject it to shocks, and also to withstand the high pressure that exists at the bottom of the sea. In addition, it must be well insulated electrically relative to the electronic circuits it contains, since these circuits may be at an electrical potential which is very different from that of the housing because of the way they are remotely powered from the ends of the cable. Finally, the housing must be effective at dumping the heat generated by the electronic circuits in order to prevent their operating temperature rising considerably which would impair their long term reliability. Present undersea cables operate at high data rates and are fitted with housings containing ever increasing densities of electronic circuits, and this increases the quantity of heat that needs to be dissipated. It is therefore necessary to increase the dissipation capacity of repeater housings, and to take care that such dissipation is uniform for all of the electronic circuits contained in a repeater.

French patent application No. 2 630 575 corresponding to U.S. Pat. No. 4,962,445 describes a housing comprising:

a thermally conductive rigid body in the form of a circular section cylinder closed in watertight manner at its ends;

thermally conductive rigid receptacles each having a face which is complementary in shape to the shape of the inside wall of the body, e.g. in the form of a 60° sector of a cylinder, if there are six receptacles;

copper wire mats placed between the walls and respective faces of the receptacles to transmit heat from the receptacles to the body;

a mechanical device to press each receptacle and its mat against the wall, thereby ensuring good thermal contact between the mat and the receptacle and between the mat and the wall.

The mechanical device includes two split annular type springs placed at respective ends of the housing and each surrounded by the six receptacles. The receptacles bear against the annular springs via V-section supports. Each support bears against the outside wall of an annular spring via the inside walls of its V-shape. The outside walls of the V-shape constitute two bearing surfaces respectively for two receptacles. For a housing including six receptacles, there are three supports at each end of the housing.

Two receptacles are hinged to each support, with each receptacle including two pegs placed at respective ends of the receptacle in the vicinity of one of its long sides. The pegs of two receptacles hinged to the same support pivot in two very close together holes through the support. The two receptacles are free to rotate about these pegs when the set of receptacles is removed from the housing for maintenance operations. When the receptacles are placed inside the housing they no longer pivot, they bear constantly against the outside walls of the V-shape, and the assembly behaves as though the two receptacles and their two supports constituted a single rigid part subjected to radially-outward forces generated by the two annular springs.

Each support has a certain amount of freedom to move in translation in a radial direction in order to enable the springs to thrust the set of two receptacles and their mats against the wall. In addition, each support is free to rotate about an axis parallel to the axis of symmetry of the housing. By virtue of these two degrees of freedom, the forces exerted by the two springs are distributed over the ends of the six receptacles. The way these forces are distributed depends on the irregularities in the gaps that remain between the receptacles and the wall, and also on the irregularities of the distribution of matter within the copper wire mats. The size of the gap remaining between a receptacle and the wall depends in particular on the deformation to which the body is subjected by high, deep-sea pressure. It may also be affected by displacement of the receptacles due to a violent shock during laying. The forces exerted by a single spring on the ends of the six receptacles are interdependent. They are poorly determined and therefore poorly distributed because of this interdependence and because of the absence of any adjustment means. This gives rise to non-uniformity in the pressure on the various mats and consequently to non-uniformity in the thermal conduction between the receptacles and the wall. Some receptacles are therefore at a higher temperature than others for the same amount of heat generated by their electronic circuits.

SUMMARY OF THE INVENTION

An object of the invention is to remedy this non-uniformity in force distribution in order to obtain thermal conduction that is as uniform as possible for all of the receptacles. The present invention provides a housing in which the mechanical means for pressing each receptacle against the wall exert individual forces that are adjustable independently.

According to the invention, a housing for underwater electronic circuits comprises:

a thermally conductive rigid body in the form of a circular section cylinder closed in watertight manner at its ends;

a plurality of thermally conductive rigid receptacles each having a face that is complementary in shape to the shape of the inside wall of the body, said receptacles containing electronic circuits;

layers of thermally conductive flexible materials placed between said wall and said faces; and thrust means for pressing each receptacle and the layers of flexible material against said wall;

the housing being characterized in that the thrust means comprise, at least one end of the housing:

a plurality of fixing devices fixed to the body and regularly distributed around the axis of symmetry of the body, each fixing device exerting an individually adjustable radially-outward force; and force-transmitting means for transmitting the radially-outward force exerted by each fixing device to at least one of the receptacles.

The means for transmitting the force exerted by each fixing device to a receptacle may include a resilient device, such as spring washers or a spring, thereby enabling each fixing device to continue to exert more or less constant pressure even if the gap between the faces of the receptacles and the inside wall of the body is changed by deformation or by a shock.

In addition, this resilient device makes for smoother adjustment of the force exerted by each fixing device.

The thrust means may further include a first ring at each end of the housing; the force-transmitting means may include a plurality of supports at each end of the housing, and may further include a plurality of supports, each fixed to the end of at least one receptacle; each fixing device including a screw screwed radially into the first ring; and the resilient device of each fixing device may be interposed between the screw of said fixing device and one of the supports. The first ring makes it possible to drill holes for receiving the screws which would be more difficult to perform and to monitor if machining directly into the thickness of the wall because of the additional danger of weakening its mechanical strength. The supports serve to transmit and to distribute the force exerted by the screws, and optionally they make it possible to group together a plurality of receptacles.

Each first ring may be removable and be fixed to a fixed second ring which is integral with the wall; and in addition the first and second rings may make contact with one another solely via radial surfaces, the other surfaces of the pairs of rings not making contact and being separated by predetermined amounts of clearance, for the purpose of providing relative independence between the two rings, together with some shock-absorbing in the event of a shock on the outside of the body being transmitted by the second ring, thereby preventing such a shock propagating to the receptacles and damaging the electronic circuits.

A sector of the second ring situated at one of the ends of the housing may be missing, e.g. over an angle of 120°, thereby facilitating insertion of the receptacles into the body; in which case the first ring should have a sector of increased thickness filling the gap left empty in the second ring, so that when assembled together the first and second rings constitute a ring of constant thickness and thus of constant mechanical strength. If so desired, a particular embodiment of the housing of the invention makes it possible to insulate one or more receptacles electrically from the inside wall of the body.

BRIEF DESCRIPTION OF THE DRAWINGS

An embodiment of the invention is described by way of example with reference to the accompanying drawings, in which:

FIG. 4 is an end view of a portion of said embodiment, showing in particular a support and a corresponding two-receptacle insulating piece;

FIG. 5 is a fragmentary section view showing a detail of how the support is fixed to the insulating piece;

FIG. 6 is a fragmentary section view through a portion of this embodiment;

FIG. 7 is a fragmentary section view through a different portion of this embodiment, showing the clearance left between the first and second rings.

DETAILED DESCRIPTION

Figure 1:
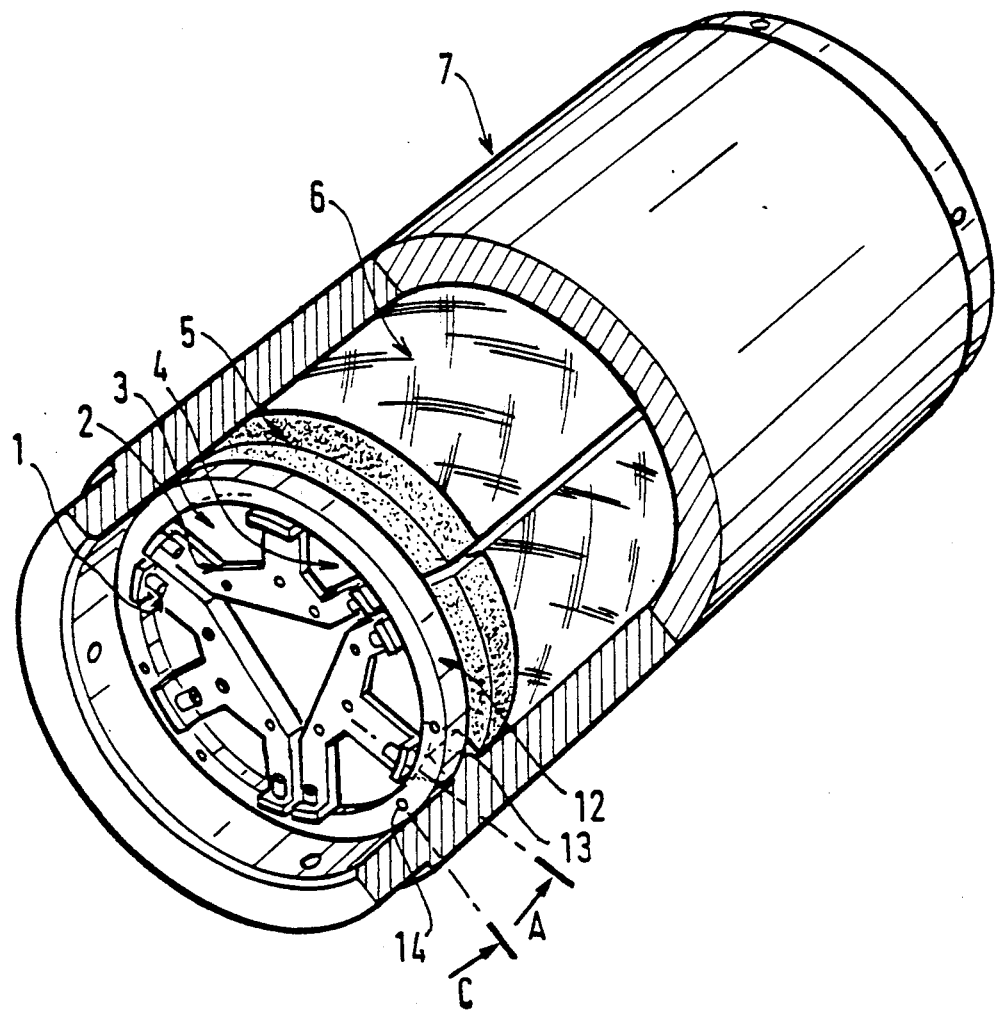
FIG. 1 is an overall view of this embodiment.

FIG. 1 does not show the covers which would normally close both ends of the housing in watertight manner. The housing comprises a steel body 7 which is shown partially cutaway to reveal other components of the housing.

In this embodiment, the housing contains six receptacles such as the receptacles 3 and 4 each having an outer longitudinal face in the form of a sector of a cylinder occupying 60° and extending parallel to the inside wall of the body 7. The receptacles are fixed in pairs on three supports at each end of the housing. For example, the receptacles 3 and 4 are fixed to a support 2 which is itself fixed to a removable ring 12 by means of three fixing devices 1 which are described below and which exert radially-outward radial forces on the support 1. The removable ring 12 is fixed by means of four screws 14 to a fixed ring 13 which is integral with the inside wall of the body 7. The rings 12 and 13 are made of steel. Details of the construction of the two rings 12 and 13 are described below.

At the other end of the housing (not visible in the figure) the receptacles 3 and 4 are fixed to a support identical to the support 2. Two rings similar to the rings 12 and 13 support the receptacles 3 and 4 by means of said support. These rings are described below.

The outer longitudinal faces of the two receptacles (3, 4) mounted on the same support are covered by a mat 6. Each of these mats is essentially made of knitted copper wires, and serves to conduct heat from the receptacles to the body 7. As appears from the description below, the mat 6 is surrounded by a flexible metal gauze which prevents any risk of the ends of copper wires escaping from the knit and dispersing inside the housing. If it is necessary to insulate the receptacles electrically from the body 7, a sheet 50 of insulating material, FIG. 7 is interposed between the mat 6 and the corresponding area of the inside wall of the body. For the same purpose, the support 2 of each pair of receptacles is provided with an insulating piece 5 referred to as an insulating cap which insulates the end of said pair of receptacles and the end of the corresponding mat 6 from the body 7. The fixed ring 13 is situated between the removable ring 12 and the insulating caps such as the cap 5, with the removable ring 12 being the part closest to the end of the housing.

Figure 2:
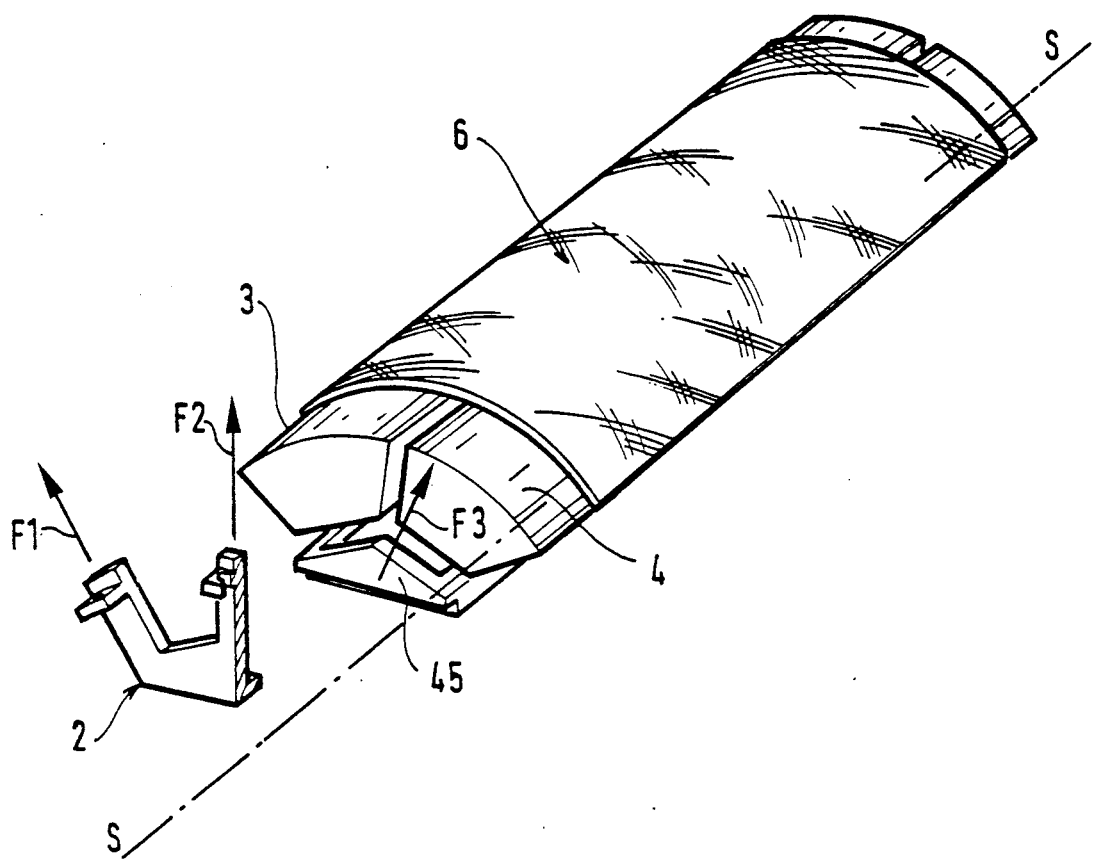
FIG. 2 shows and illustrates how the radially-outward forces are applied to the receptacles.

FIG. 2 shows a pair of receptacles 3 and 4 together with their mat 6, a support 2 shown cut in half on its plane of symmetry, and a spacer 45; thereby showing how the three forces F1, F2, and F3 exerted by the three fixing devices such as the device 1, FIG. 6, are transmitted.

These forces are radial and outward relative to the axis of symmetry S—S of the housing, and they are individually adjustable. They are applied to three branches of the support 2 which is fixed to one end of the spacer 45. The two receptacles 3 and 4 rest on the spacer 45. The support 2 and the spacer 45 transmit the forces F1, F2, and F3, and distribute them over the full length of the receptacles. The forces F1, F2, and F3 are adjusted so as to obtain uniform pressure on the mat 6.

The details of the structure of the support 2 and the spacer 5, and the way in which they are assembled are described below.

Figure 3:
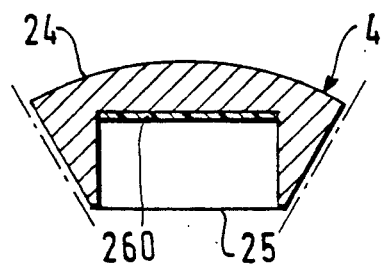
FIG. 3 is a section view of a receptacle and the electronic circuits it contains.

FIG. 3 is a cross-section through the receptacle 4, given by way of example. Its section occupies a circular sector having an angle of close to 60°, and truncated at 25 towards the axis of symmetry SS of the housing. A rectangular cavity is hollowed out from this truncated face 25. An electronic circuit 260 is fixed inside this cavity so that the heat it produces diffuses through the receptacle 4 towards its outside surface 24.

FIG. 4 is an end view of the receptacles 3 and 4 fixed to the support 2, the support being fitted with its insulating cap 5, the mat 6, and the spacer 45. The mat 6 comprises a layer of copper wire knit 34 enveloped in a flexible metal gauze 32 which comes into contact firstly with each of the outer longitudinal faces of the receptacles and secondly with the inside wall of the housing body or with the insulating sheet 50 previously glued to said inside wall of the body over the receptacles if it is necessary to insulate the receptacles 3 and 4 from the body. Naturally, under such circumstances, the insulating sheet 50 must be thin enough to be capable of transmitting heat while still being thick enough to ensure electrical insulation. The cap 5 is fixed to the support 2 by three polyamide screws 35, 39, and another screw, not shown, but screwed into tapped hole 31. The support 2 is fixed to a spacer 45 by three screws 41 to 43. The receptacle 3 and the receptacle 4 are fixed to the support 2 by pegs 20 to 23. They bear against the spacer 45 via bearing surfaces 54 and 58. The spacer 45 bears against the support 2 via a shoulder 33.

FIG. 5 is a fragmentary section through the support 2 when associated with receptacles 4 and cap 5, the section being as seen looking at line BB. This figure shows that peg 23 is constituted by a set screw whose head is the same diameter as its threaded shank. This head is received in a smooth hole formed in the support 2. The cap 5 is screwed against the support 2 on its side opposite from the receptacles 4 by means of a screw 39 having a countersunk head such that the head of the screw is received within the thickness of the cap 5. The cap 5 is installed after the screw 23 and corresponding screws constituting the pegs 20, 21, and 22 have been put in place. These screws do not project outside their holes in the support 2 and they are masked by the cap 5 once it has been put into place.

The general shape of the support 2 is a plane shape, occupying a sector of a disk having an angle of 120°. It includes three lugs 29, 38, and 28 which are orthogonal to the plane of the support 2 and which are pierced by three respective smooth holes 30, 36, and 27 which coincide with smooth holes 37, 26 pierced in the cap 5. Since a piece of the cap 5 is not shown in FIG. 4, the hole corresponding to the hole 30 in the support 2 is not shown. These holes are intended to fix the support 2 to the removable ring 12 by having fixing devices 1 (not shown) inserted therein.

FIG. 6 is a fragmentary section view of this embodiment, seen in direction AA shown in FIGS. 1 and 4. The section plane includes the axis of symmetry SS of the housing and the axes of the screws 35 and 42, i.e. it passes between the receptacles 3 and 4 without intersecting either of them. FIG. 6 shows the disposition of one of the fixing devices 1 relative to: the insulating cap 5; the removable ring 12; the support 2; and the fixed ring 13. This figure shows the spacer 45 which runs parallel to the receptacles 3 and 4 and which itself constitutes a receptacle for electronic circuits 46 that dissipate little power and which may therefore be placed close to the axis of symmetry of the housing. The spacer 45 bears against a shoulder 33 and is fixed to the support 2, in particular by the screw 42.

The receptacle 3 which is fixed to the support 2 by the pegs constituted by the screws 20 and 21 and which are not visible in FIG. 6 bears against each of the edges 58 of the two ends of the spacer 45 and against its outer longitudinal edge 54. These edges are machined at an angle enabling them to offer a contact plane which is exactly complementary to that of the receptacle 3. The support therefore transmits a force to the receptacle 3 via the spacer 45 suitable for pressing the receptacle against the mat 6 bearing against the body 7. The cap 5 insulates the support 2 and in particular its lug 38, and it insulates the end of the receptacle 3 from the two rings 12 and 13 and from the body 7. The cap 5 is fixed to the support 2 in particular by the screw 35. The metal gauze 32 covering the mat 6 is clamped between the cap 5 and the outside face of the receptacle 3.

The fixing device 1 is a resilient and electrically insulating subassembly comprising: a screw 49 having a head with a hex socket; a pair of Belleville type spring washers 48; an insulating sleeve 47 surrounding the head of the screw 49, the pair of washers 48 situated adjacent to the head, and the shank of the screw 49 where it passes through the holes 36 and 37 respectively through the support 2 and the cap 5. The screw 49 is screwed radially outwardly into the removable ring 12. Since the ring 12 is also fixed to the fixed ring 13, tightening the screw 49 compresses the pair of washers 48, thereby transmitting a force to the support 2 via the sleeve 47. This force presses the cap 5 against the removable ring 12.

The presence of the pair of spring washers 48 makes it possible to apply a very smoothly adjustable force by tightening the screw 49 to a greater or lesser extent. The force exerted may be adjusted accurately by using a torque screwdriver for tightening the screw 49. The resilient washers 48 also make it possible to maintain a force that is more or less constant even if variations should occur in the size of the gap between the body 7 and the receptacle 3, for example if pressure deforms the wall of the body 7 or if a violent shock manages to displace the receptacle 3 relative to the body 7. In addition, these resilient washers contribute to damping the transmission of a shock to the electronic circuits in the event of a shock displacing the receptacles 3 and 4 radially inwards since under such circumstances the washers are momentarily compressed prior to returning to their initial shape.

FIG. 7 is on a larger scale than FIG. 6 and is a fragmentary section through the same embodiment as seen in direction C shown in FIG. 1. The plane of the section includes the axis of symmetry of the housing and one of the screws 14 for fixing the removable ring 12 to the fixed ring 13. It shows the various clearances J1 to J4 that are provided between these two rings in order to reduce the transmission of shocks from the fixed ring 13 to the removable ring 12, and thus to the electronic circuits via the support 2, in the event of stresses exceeding the mechanical characteristics of the fixing devices 1. FIG. 7 shows that the rings 12 and 13 are in contact solely via a plane surface which extends radially, while their other surfaces are separated by predetermined amounts of clearance.

The screw 14 fixes the removable ring 12 to the fixed ring 13. The axis of the screw 14 is parallel to the axis of symmetry of the housing. It passes through the ring 12 via a smooth hole 16 leaving clearance J3. It is screwed into a tapped hole 15 in the ring 13, and its threaded shank does not project beyond the other end of the hole 15. The head of the screw 14 is contained with clearance J2 in a countersink 17. The removable ring 12 has a shoulder 44 extending the ring 12 to overlie the portion of the ring 13 which is closest to the axis of symmetry of the housing, but leaving clearance J4. The periphery of the ring 12 is parallel to the wall of the body 7, leaving clearance J1.

The clearance gaps J1 to J4 prevent shock being transmitted directly from the body 7 to the ring 12, with transmission taking place only by friction between contacting radial surfaces, and by friction between the head of the screw 14 and the bottom of the countersink 17, which also constitutes a plane radial surface.

In this embodiment, clearances J1, J2, and J3 are 0.5 mm across while clearance J4 is 0.25 mm across. The clearance J4 is the smallest so that in the event of a violent shock displacing the ring 12 relative to the ring 13, then the shoulder 44 comes into abutment against the ring 13, thereby preventing the threaded shank of the screw 14 being sheared by the ring 12.

FIG. 7 also shows clearance J5 between the cap 5 and the inside wall of the body 7 together with the fixed ring 13. This clearance J5 is greater than J1 in order to prevent shock being transmitted by the insulating cap 5.

FIG. 7 shows a sheet 50 which is electrically insulating and thermally conductive and which is glued to the inside wall of the body 7 to insulate the metal gauze 32 electrically.

Figure 8:
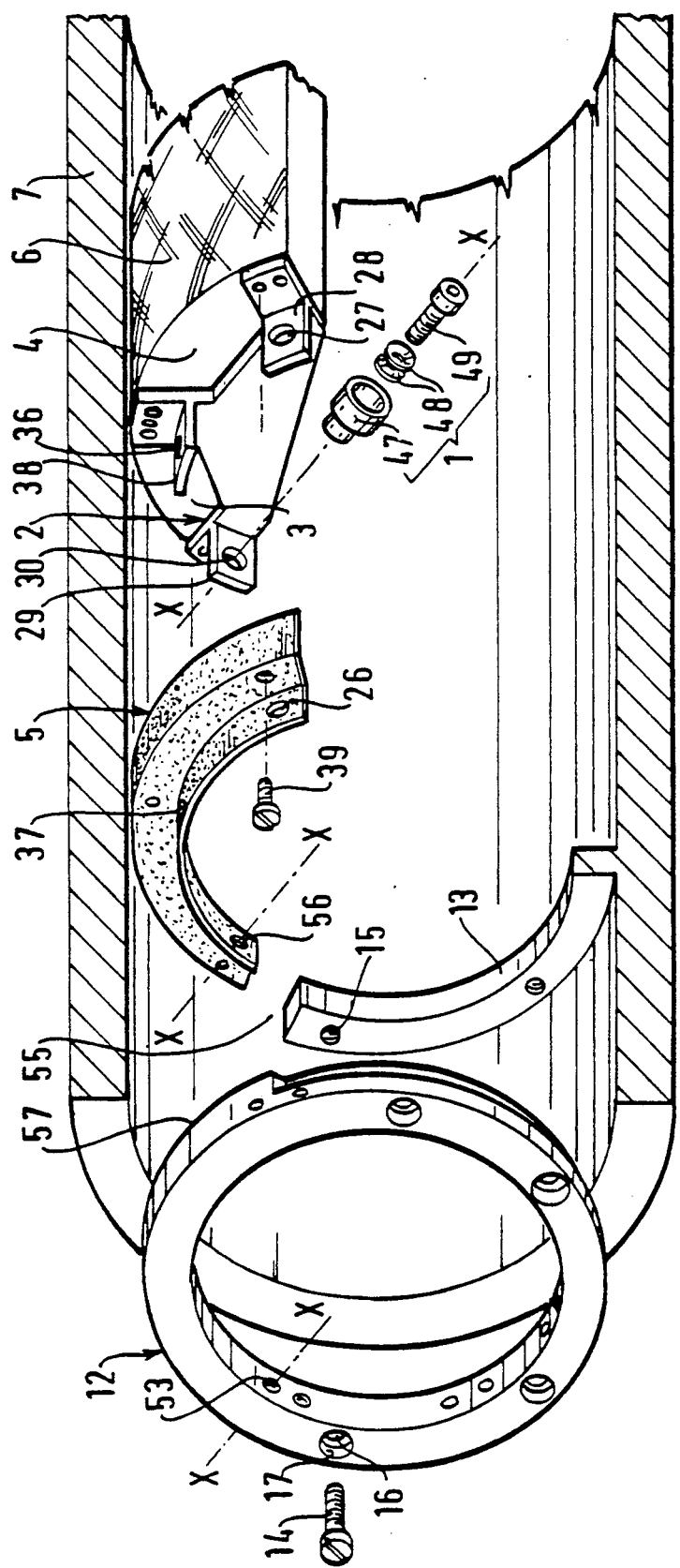
FIGS. 8 and 9 are two exploded views respectively of the first end and of the second end of this embodiment.

FIG. 8 is an exploded view in section through a first end of this embodiment showing how the removable ring 12, the insulating cap 5, and the support 2 carrying receptacles 3 and 4 and their mat 6 are assembled. These parts are installed in the order in which they are described below.

The receptacles 3 and 4 are initially fixed to the support 2 which is already fitted with the spacer 45, they are then provided with the mat 6 and the cap 5, with the cap being fixed by three screws such as the screw 39.

In all three subassemblies made up in this way are inserted successively into the body 7. In order to facilitate installing these three subassemblies, the fixed ring 13 which is integral with the body 7 and which therefore cannot be removed extends over a sector of 240° only. An empty sector 55 makes it possible to insert a subassembly in the form of a cylindrical sector occupying an angle of 120°.

Thereafter, the removable ring 12 is installed against the fixed ring and it is fixed by means of four screws 14 passing through smooth holes 16 formed in the ring 12. These screws 14 are screwed into tapped holes 15 in the ring 13. The axes of these screws are parallel to the axis of the body 7. The ring 12 includes a sector 57 of increased thickness to fill the gap of the empty sector 55 in the ring 13. The extra thickness of the sector 57 thus remedies the discontinuity in the ring 13 and ensures that the housing has uniform mechanical strength around its axis of symmetry. Finally, the supports 2 are fixed to the ring 12 and the mats 6 are put under pressure by the fixing devices 1.

The support 2 is fixed by initially installing a fixing device 1 in the hole in the lug 38 situated in the plane of symmetry of the support 2. This first fixing device (not shown) serves to move the end lugs of the support 2 closer to the inside wall of the removable ring 12 until the holes of the lugs 28 and 29 coincide substantially with the tapped holes such as the hole 53 formed in the removable ring 12 and intended to receive the fixing devices 1. Until such coincidence has been achieved, it is not possible to screw in the other two fixing devices.

By way of example, FIG. 8 also shows the axis XX on which a fixing device 1 lies when passing through the hole 30 of the lug 29, then corresponding hole 56 in the cap 5 and then being screwed into a tapped hole 53 in the removable ring 12. This fixing device is analogous to that used for fixing the lug 38 to the ring 12 and to that used for fixing the lug 28.

By using a torque screwdriver or screws with shoulders, it is possible to adjust the force exerted by each fixing device 1 accurately such that the forces are identical on the lugs 28 and 29 at both ends of each pair of receptacles, thereby obtaining uniform pressure on each mat 6.

Figure 9:
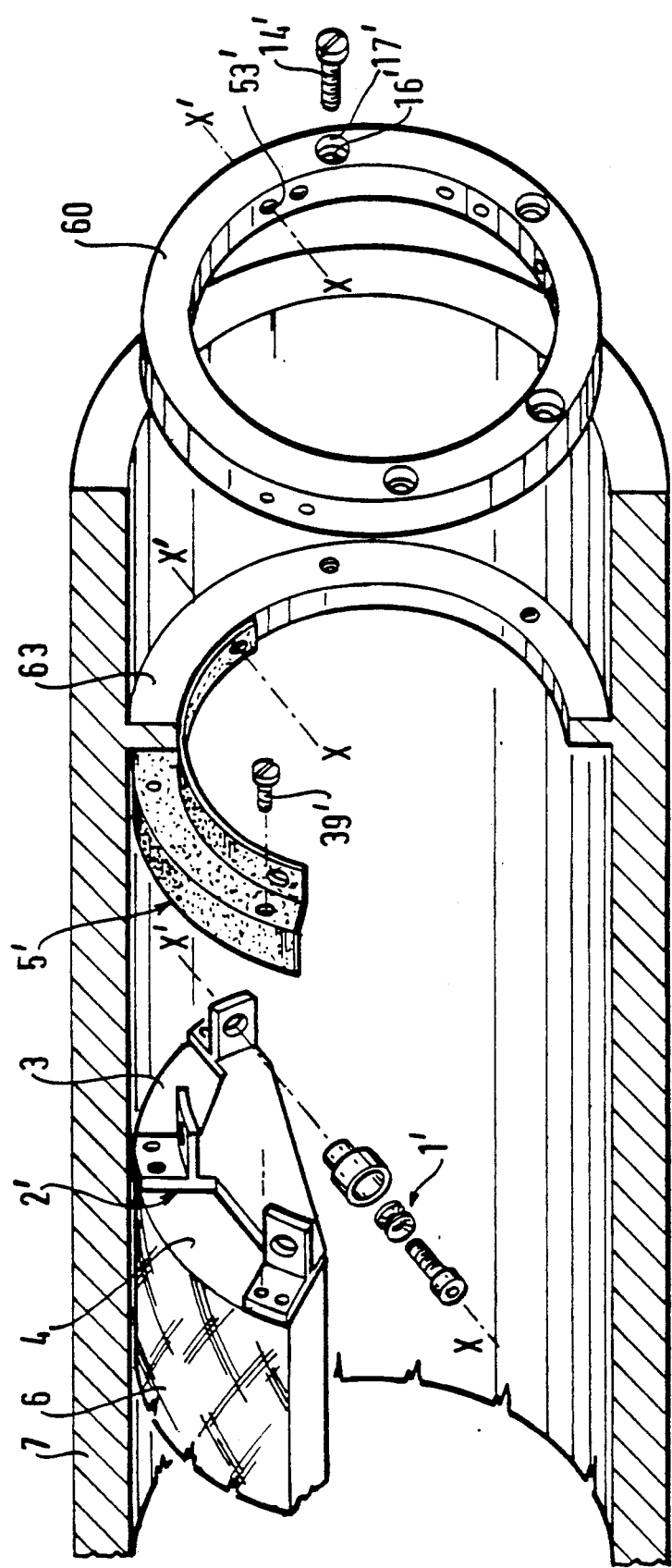

FIG. 9 is an exploded section view showing the other end of the housing. Most of the items are identical to those described above, in which case they are given the same reference numerals plus the prime symbol '. The only difference lies in the fact that this end is not used for inserting subassemblies into the body. Consequently, there is no need to eliminate a sector from the fixed ring. This end thus includes a fixed ring 63 which occupies a complete 360° of the inside wall of the body 7; and consequently a removable ring 60 does not have a sector of increased thickness.

The scope of the invention is not limited to the example described above. The person skilled in the art is capable of adapting this housing to differing numbers of supports or receptacles occupying circular sectors. The fixing devices for pressing the receptacles against the wall may include resilient means that are different, e.g. helical springs.

The number of fixing devices per support may be other than three. There must be at least one fixing device per support, but otherwise the number is not limited.

We claim:

1. In a housing for underwater electronic circuits, comprising:
   a thermally conductive rigid body in the form of a circular section cylinder closed in watertight manner at its ends;
   a plurality of thermally conductive rigid receptacles each having a face that is complementary in shape to the shape of the inside wall of the body, said receptacles containing electronic circuits;
   layers of thermally conductive flexible materials placed between said wall and said faces; and
   thrust means pressing each receptacle and the layers of flexible material against said wall;
   the improvement wherein the thrust means comprise, at least at one end of the housing;
   a plurality of fixing devices fixed to the body and regularly distributed around the axis of symmetry of the body, each fixing device exerting an individually adjustable radially-outward force; and
   force-transmitting means transmitting the radially-outward force exerted by each fixing device to at least one of the receptacles.

2. A housing according to claim 1, wherein each of the fixing devices includes at least one element for resiliently applying the radially outward force on said at least one said receptacle.

3. A housing according to claim 2, wherein:
   the thrust means further include a first ring at each end of the housing;
   the force-transmitting means include a plurality of supports at each end of the housing together with a plurality of spacers; each spacer being fixed to two supports situated at respective opposite ends of the housing and supporting at least one receptacle;

each fixing device including a screw screwed radially into the first ring; and the at least one resilient element of each fixing device is interposed between the screw of said fixing device and one of the supports.

4. A housing according to claim 3, wherein each first ring is removable and is fixed to a fixed second ring which is integral with the wall; and wherein the first and second rings make contact with one another solely via radial surfaces, and have other surfaces of the pairs of rings out of contact and being separated by predetermined amounts of clearance.

5. A housing according to claim 4, wherein in order to facilitate installing receptacles inside the body, a sector of the second ring situated at one of the ends of the housing is missing; and wherein the first ring fixed to said second ring includes a sector of increased thickness sized to and occupying the empty space formed by the missing sector.

6. A housing according to claim 3, wherein in order to insulate the receptacles electrically from the body the housing further includes at each end thereof:

insulating sleeves surrounding respective ones of the screws to insulate them from the supports;

insulating pieces carried by respective ones of the supports and the receptacles from the first and second rings and;

a thin sheet of an electrically insulating material interposed between the wall of the body and the layers of thermally conductive flexible materials.

* * * * *